US012603133B2

(12) United States Patent
    Ciocchini et al.

(10) Patent No.: US 12,603,133 B2
(45) Date of Patent: Apr. 14, 2026

(54) SLOW CHARGE LOSS MONITOR FOR POWER UP PERFORMANCE BOOSTING

(71) Applicant: MICRON TECHNOLOGY, INC., Boise, ID (US)

(72) Inventors: Nicola Ciocchini, Boise, ID (US); Ugo Russo, Boise, ID (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 18/431,886

(22) Filed: Feb. 2, 2024

(65) Prior Publication Data

US 2024/0274202 A1      Aug. 15, 2024

Related U.S. Application Data

(60) Provisional application No. 63/444,498, filed on Feb. 9, 2023.

(51) Int. Cl.
    *G11C 16/10*        (2006.01)
    *G11C 16/28*        (2006.01)
    *G11C 16/30*        (2006.01)
    *G11C 16/34*        (2006.01)

(52) U.S. Cl.
    CPC .............. *G11C 16/10* (2013.01); *G11C 16/28* (2013.01); *G11C 16/30* (2013.01); *G11C 16/34* (2013.01)

(58) Field of Classification Search
    CPC ......... G11C 16/10; G11C 16/28; G11C 16/30; G11C 16/34; G11C 11/5628; G11C 16/0483; G11C 16/3459
    See application file for complete search history.

(56) References Cited

U.S. PATENT DOCUMENTS

| | | | |
|---|---|---|---|
| 2012/0239976 A1* | 9/2012 | Cometti | G11C 16/26 |
| | | | 714/24 |
| 2013/0007543 A1* | 1/2013 | Goss | G11C 16/349 |
| | | | 714/718 |
| 2016/0211032 A1* | 7/2016 | Pang | G11C 11/5621 |

* cited by examiner

*Primary Examiner* — Francisco A Grullon
(74) *Attorney, Agent, or Firm* — Lowenstein Sandler LLP

(57)                ABSTRACT

A memory sub-system having a memory device with a plurality of cells and a processing device operatively coupled to the memory device, the processing device to perform the operations of: responsive to detecting a power off event, programming, to a predefined logical state, a dummy subset of the plurality of cells; responsive to detecting a power-up event, determining a voltage shift associated with the dummy subset of the plurality of cells; and identifying, based on the voltage shift, a voltage offset bin shift corresponding to a voltage offset bin associated with a specified subset of the plurality of cells.

20 Claims, 7 Drawing Sheets

550

| Bin Before Voltage Shift | Bin After Voltage Shift | |
|---|---|---|
| | Larger Voltage Shift | Smaller Voltage Shift |
| 0 | 4 | 2 |
| 1 | 4 | 3 |
| 2 | 4 | 3 |
| 3 | 5 | 3 |
| 4 | 5 | 4 |
| 5 | 6 | 5 |
| 6 | 6 | 6 |
| 7 | 7 | 7 |

510

Block Family-based Error Avoidance (BFEA) Table

| Block Family | Die0 | Die1 |
|---|---|---|
| 1 | 1 | 1 |
| 2 | 6 | 5 |
| ⋮ | ⋮ | ⋮ |
| 64 | 3 | 4 |

520 Update

530

Updated BFEA Table

| Block Family | Die0 | Die1 |
|---|---|---|
| 1 | ~~1~~ 4 | ~~1~~ 4 |
| 2 | 6 | ~~5~~ 6 |
| ⋮ | ⋮ | ⋮ |
| 64 | ~~3~~ 5 | ~~4~~ 5 |

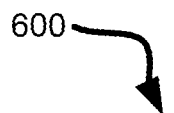

```
┌─────────────────────────────────────────────┐
│     Responsive to detecting a power-off event, │
│   programming, to a predefined logical state, a │
│          dummy subset of a plurality of cells    │
│                       610                        │
└─────────────────────────────────────────────┘
                        │
                        ▼
┌─────────────────────────────────────────────┐
│     Responsive to detecting a power-up event,   │
│        determining a voltage shift associated   │
│   with the dummy subset of the plurality of cells │
│                       620                        │
└─────────────────────────────────────────────┘
                        │
                        ▼
┌─────────────────────────────────────────────┐
│          Identifying, based on the voltage shift, │
│   a voltage offset bin shift corresponding to a voltage │
│    offset bin associated with a specified subset of the │
│                    plurality of cells.           │
│                       630                        │
└─────────────────────────────────────────────┘
```

SLOW CHARGE LOSS MONITOR FOR POWER UP PERFORMANCE BOOSTING

CLAIM OF PRIORITY

The present application claims the benefit under 35 U.S.C. § 119(e) of U.S. Provisional Patent Application No. 63/444,498 filed Feb. 9, 2023, which is incorporated by this reference herein.

TECHNICAL FIELD

Embodiments of the disclosure relate generally to memory sub-systems, and more specifically, relate to a slow charge loss (SCL) monitor for power up performance boosting.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 6 is a flow diagram of an example method in accordance with some embodiments.

DETAILED DESCRIPTION

Figure 1:
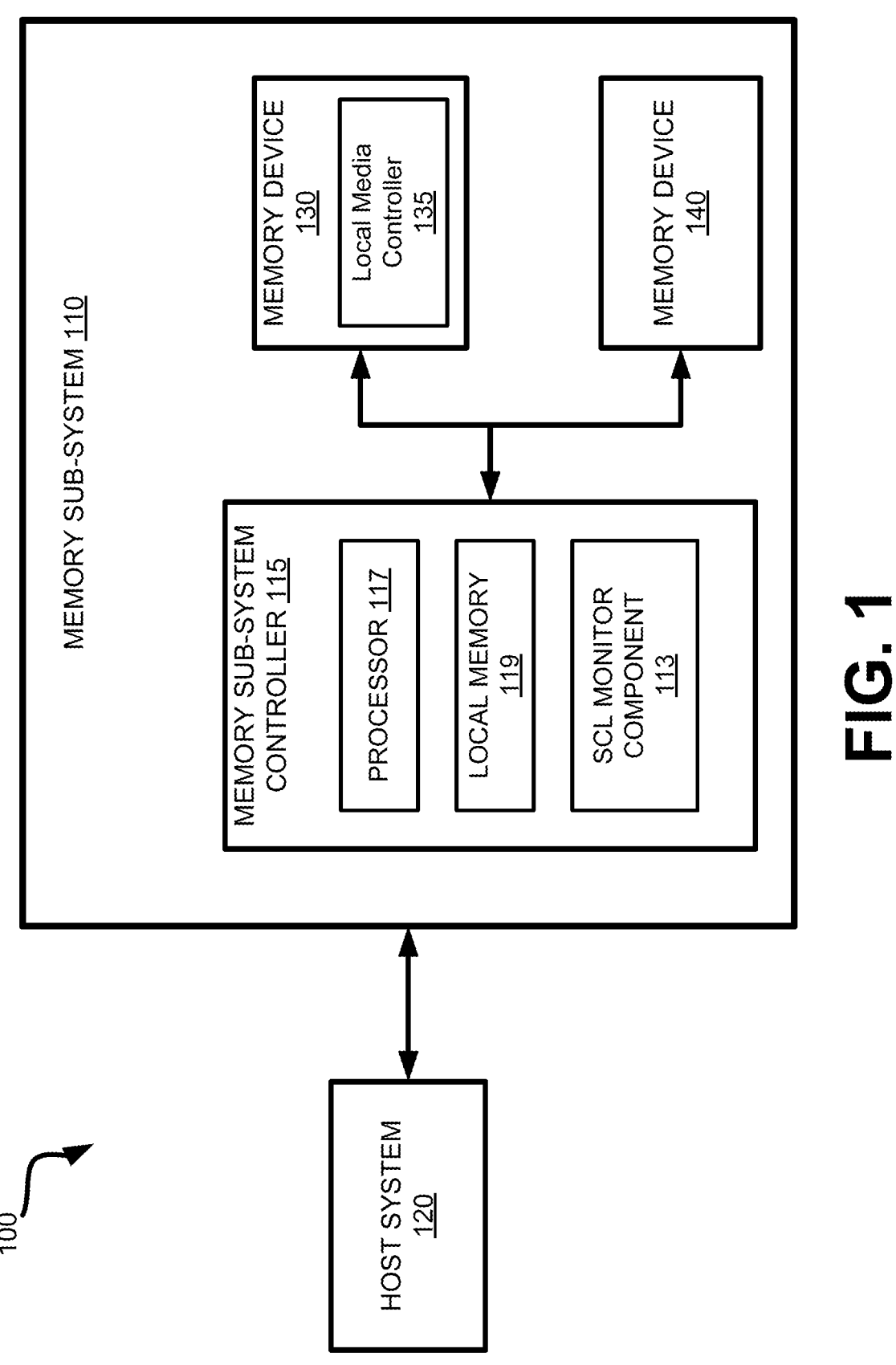
FIG. 1 illustrates an example computing system that includes a memory sub-system in accordance with some embodiments of the present disclosure.

Aspects of the present disclosure are directed to a slow charge loss (SCL) monitor for power up performance boosting. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a NOT-AND (NAND) memory device. Other examples of non-volatile memory devices are described below in conjunction with FIG. 1. A non-volatile memory device is a package of one or more dies. Each die may include one or more planes, such that each plane carries a matrix of memory cells formed onto a silicon wafer and joined by conductors referred to as wordlines and bitlines, such that a wordline joins multiple memory cells forming a row of the matrix of memory cells, while a bitline joins multiple memory cells forming a column of the matrix of memory cells. For some types of non-volatile memory devices (e.g., NAND devices), each plane includes of a set of physical blocks. A "block" herein refers to a set of contiguous or non-contiguous memory pages. An example of a block is an erasable block, which is a minimal erasable unit of memory, while a page is a minimal writable unit of memory. Each page includes of a set of memory cells ("cells"). A cell is an electronic circuit that stores information. Depending on the cell type, each memory cell can store one or more bits of binary information, and has various logic states that correlate to the number of bits being stored. The logic states can be represented by binary values, such as "0" and "1," or combinations of such values. A set of memory cells referred to as a memory page can be programmed together in a single operation, e.g., by selecting consecutive bitlines.

The memory sub-system can perform host-initiated memory access operations. For example, the host system can initiate a data operation (e.g., write, read, erase, etc.) on a memory sub-system. The host system can send access requests (e.g., write command or read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the cell to establish multiple threshold voltage levels corresponding to different logical levels, thus effectively allowing a single memory cell to store multiple bits of information: a memory cell operated with $2^n$ different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells. Thus, a read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss (SCL), the threshold voltage ($V_T$) of a memory cell changes in time as the electric charge of the cell is degrading (e.g., voltage shifts). The threshold voltage shift from SCL can be referred to as "temporal voltage shift," since the degrading electric charge causes the voltage distributions to shift along the voltage axis towards lower voltage levels. The threshold voltage changes rapidly at first (e.g., immediately after the memory cell was programmed), and then slows down in an approximately logarithmic linear fashion with respect to the time elapsed since the cell programming event. Accordingly, failure to mitigate the temporal voltage shift caused by the slow charge loss can result in an increased bit error rate in read operations.

A memory sub-system can mitigate the temporal voltage shift (TVS) by employing block family-based error avoidance (BFEA) strategies. BFEA tracks the TVS to keep each block (or pages within a block) calibrated well enough to have an acceptable bit error rate (BER). "Calibration" herein shall refer to adjusting a read level value (for example, by adjusting a read level offset or read level base value) to perform read operations within the acceptable BER. The TVS is tracked for selective programmed blocks grouped by block families, and appropriate voltage offsets-which are based on block affiliation with a certain block family—are applied to the base read levels in order to perform read operations. "Block family" herein shall refer to a set of blocks that have been programmed within a specified time window and a specified temperature window. Since the time elapsed after programming and temperature are the main factors affecting the TVS, all blocks and/or partitions within a single block family are presumed to exhibit similar distributions of threshold voltages in memory cells, and thus would require the same voltage offsets to be applied to the base read levels for memory operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family, and/or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (also referred to as a calibration scan) in order to evaluate a data state metric (e.g., a bit error rate, "BER") and associate each block family with a predefined time after programming (TAP) bin. Each TAP bin can correspond to a specific voltage offset to be applied for read operations. The bins can be numbered from 0 to 7 (e.g., bin 0-bin 7), and each bin can be associated with a voltage offset to be applied to a base read level for read operations. The associations of block families with TAP bins (e.g., bins 0-7) can be stored in respective metadata tables (e.g., such as a BFEA table) maintained by the memory sub-system controller. In some embodiments, other numbers of bins are considered, such as for example, bins 0-3, 0-15, 0-31, etc. "BFEA table" herein shall refer to a table that reflects the aggregated TVS for all groups of memory cells (e.g., blocks) of the memory sub-system. The BFEA table for a memory sub-system can be stored by the memory sub-system controller as metadata, a reference table, or directly on a memory device. The BFEA table can store TAP bin pointers assigned to block families of the memory device. In some embodiments, the memory sub-system controller can maintain a BFEA table for each memory device.

Due to processing and/or operating conditions, $V_T$ can vary for different cells implemented on the same die. The $V_T$ of cells in a memory device can be characterized by a distribution P of the threshold voltages $P(Q, V_T)=dW/dV_T$, where dW represents the probability that any given cell has its threshold voltage within the interval $[V_T, V_T+dV_T]$ when charge Q is placed on the cell. A memory device can exhibit threshold voltage distributions $P(Q,V_T)$ that are narrow compared with the working range of control voltages tolerated by the cells of the device. Multiple non-overlapping $P(Q_k, V_T)$ ("valleys") can be fit into the working range, thus allowing for storage and reliable detection of multiple values of the charge $Q_k$, k=1,2,3 . . . etc. The distributions (valleys) can be interspersed with voltage intervals ("valley margins"). A valley margin hereinafter can be used to refer to a voltage, or set of voltages that do not correspond to a $V_T$ of a cell or cell level (e.g., the "voltage gaps" between levels such as between L0 and L1, between L1 and L2, etc.). Valley margins can be used to separate various charge states $Q_k$ (e.g., levels). The logical state of the cell can be determined by detecting during a memory operation which valley margin is directly below a cell or level $V_T$, and which valley margin is directly above a cell or level $V_T$ (e.g., by detecting which valley margins satisfy Valley-Margin$_1$<$V_T$<Valley-Margin$_2$). For example, a read operation can be performed by comparing the measured $V_T$ exhibited by the cell to one or more reference voltage levels corresponding to known valley margins (e.g., centers of the valley margins) of the memory device in order to distinguish between multiple logical programming levels and determine the programming state of the cell.

When a memory device is powered-on, the memory sub-system can compensate for the negative effects of TVS. Between memory operation requests from the host (i.e., during the downtime), the memory sub-system controller can perform BFEA scans and calibrations to detect and remedy the effects from TVS. However, when the memory device is powered-off, the memory sub-system cannot perform background BFEA scans and calibrations, and thus cannot compensate for the negative effects of TVS in real time. Additionally, the TVS experienced by a powered-off device can be different than the TVS experienced by a powered-on device under otherwise similar conditions (e.g., similar temperature). Some memory sub-systems fail to adequately address TVS experienced by a powered-off device which can result in high bit error rates (BERs). Memory sub-systems employ various strategies to address TVS.

For example, some memory sub-systems can attempt to compensate for TVS by performing a granular read-level scan on the memory device upon device power on. In a granular read-level scan, the memory sub-system can apply a series of varied read voltages to a set of cells (e.g., a block) to identify read levels that correspond to voltage thresholds ($V_T$s) for the set of cells (e.g., the voltage threshold which divides the logical levels of a cell). However, such granular read-level scans can be time and resource intensive.

In another example, some memory sub-systems can attempt to compensate for TVS by performing a quick read-level scan on the memory device upon memory device power on. In a quick read-level scan, the memory sub-system can apply a set of pre-programmed read voltages to the set of cells (e.g., the block) to identify read levels that correspond to $V_T$s for the set of cells. The memory sub-system can determine which pre-programmed read voltages of the set of pre-programmed read voltages has the lowest BER value. In comparison to the granular scan, the quick scan can be faster, but also less accurate.

During either the granular scan or the quick scan, the memory device can be inaccessible to the host. Both the granular scan and the quick scan are performed on each grouping of cells (e.g., such as a set of cells or block). Granular scans can take greater than 10s of milliseconds, up to 10s of seconds or multiple minutes to complete, which can result in increased latency experienced by the user, especially at startup. Quick scans can be completed much quicker, but inaccurate $V_T$ determinations can impact memory performance and reliability during operation. Thus, quick scans can result in reduced latency experienced by the user at startup, but also a reduced memory sub-system performance.

Aspects of the present disclosure address the above and other deficiencies by having a memory sub-system that employs an SCL monitor in combination with BFEA strategies to determine a voltage shift that occurred to a subset of cells in the memory sub-system during a power off state, and update a BFEA table based on the determined voltage shift. The voltage shift can be a result of SCL-induced TVS during the power-off state.

Upon detecting a power-off event, the memory sub-system controller can program a known location (e.g., a subset of cells, a page, etc.) of a memory device. The power-off event can be responsive to a request from a host to power-off or enter a standby mode (e.g., a "synchronous" power-off) and/or a power interruption incident (e.g., an "asynchronous" power loss). The memory sub-system controller can program the known location with, for example, a defined set of data, or a random pattern of data. The memory sub-system controller can store a $V_T$ value corresponding to the programmed subset of cells before the power-off event occurs.

Upon detecting a power-up event, the memory sub-system can determine a voltage shift by comparing the stored $V_T$ value to a new $V_T$ value. The memory sub-system can determine the new $V_T$ value by performing a series of reads on the subset of memory cells to identify a voltage distribution valley center (e.g., the center of a gap between two voltage distributions corresponding to respective logical levels of a set of memory cells). The valley center can correspond to a read voltage level resulting in the lowest detected BER.

The highest voltage distribution valley can experience a higher voltage shift than correspondingly lower voltage distribution valleys in the subset of cells. Accordingly, in some embodiments, the memory sub-system identifies the valley center of the valley between the highest programmable level of a memory cell and the second highest programmable level of the cell (e.g., the highest voltage distribution valley, such as the valley between level 6 and level 7 of a TLC cell).

Based on the determined voltage shift, the memory sub-system can determine (e.g., using a data structure) an updated corrective read offset for the subset of cells. The data structure can map the voltage shift to a corresponding corrective read offset for a specified subset of cells (e.g., a block family). The memory sub-system controller can then propagate, using the data structure, a set of updated corrective read offsets to other block families in the memory sub-system. In some embodiments, the memory sub-system controller can determine and propagate updated corrective read offsets for all block families in a memory sub-system, including for example, block families residing on separate memory devices (i.e., different memory dies).

The memory sub-system can update a BFEA table of pointers (e.g., TAP bin pointers) to reflect the updated corrective read offset for a block family due to the voltage shift from the duration of the power-off state. A TAP bin pointer for a block family corresponds the block family to a certain TAP bin (e.g., voltage offset bin). Thus, rather than determining an updated corrective read offset for each block family (e.g., various specified subsets of cells), the memory sub-system can use the determined voltage shift to determine the change to the voltage offset bin, and update the BFEA table to reflect the determined voltage offset bin changes.

Advantages of the present disclosure include faster memory access time upon power-up in comparison to granular scans, more accurate $V_T$ determinations in comparison to quick scans, a reduction in the amount of data that needs to be read at the power-up time, and improved memory device reliability and consistency. For instance, by determining the voltage shift for a subset of memory cells (rather than for all the memory cells in the memory device) and propagating the corresponding corrective read offset to throughout the memory device, aspects of the represent disclosure result in a reduction in the amount of data to be read upon power up. Performing fewer read options further results in a reduction in the amount of time it takes a memory device to power-up from a powered-off state. The memory sub-system controller can quickly update a group of blocks to a "first-guess" BFEA bin, which can improve read error handling (REH) efficiency.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes SCL Monitor Component 113 that can enable and apply an SCL monitor for power-off/standby events. In some embodiments, the memory sub-system controller 115 includes at least a portion of the SCL Monitor Component 113. In some embodiments, the SCL Monitor Component 113 is part of the host system 120, an application, or an operating system. In other embodiments, local media controller 135 includes at least a portion of SCL Monitor Component 113 and is configured to perform the functionality described herein.

The SCL Monitor Component 113 can determine a voltage shift experienced by memory cells of a memory device (e.g., memory device 130 or memory device 140, etc.) during a power-off state of the memory sub-system 110. In some embodiments, the voltage shift can be due to SCL-induced TVS. To accomplish this, SCL Monitor Component 113 can program a subset of cells before power off/standby event. The location of the subset of cells can be stored in a system metadata area. Upon detecting a power-up event, SCL Monitor Component 113 can cause a series of read voltages to be applied to the subset of cells. SCL Monitor Component 113 can identify which read voltage of the series of read voltages has the lowest BER value and can assign the read voltage with the lowest BER as an updated $V_T$ value for the subset of cells. SCL Monitor Component 113 can determine the voltage shift of the programmed subset of cells by comparing an initial $V_T$ value with the updated $V_T$ value for the programmed subset of cells. Further details with regard to determining the voltage shift are described below with reference to FIG. 4.

The SCL Monitor Component 113 can use the determined voltage shift of the programmed subset of cells to identify a voltage offset bin shift corresponding to a voltage offset bin associated with a specified subset of cells. SCL Monitor Component 113 can identify the voltage offset bin shift with a data structure (e.g., a binset table). The binset table can include multiple records, each record mapping a value of the determined voltage shift to a corresponding value of the voltage offset bin shift associated with the voltage offset bin corresponding to the specified subset of cells. For a given voltage shift, the voltage offset bin shift for lower bins (e.g., bin 0, bin 1, etc.) can be larger than the voltage offset bin shift for a higher bin (e.g., bin 4, bin 5, etc.). For example, a voltage shift can cause a block family in bin 0 to move to bin 4, and a block family in bin 4 to remain in bin 4.

The SCL Monitor Component 113 can store the relationship between the specified subset of cells (e.g., a block family) and associated voltage offset bin in a data structure (e.g., a BFEA table). The SCL Monitor Component 113 can update the data structure by adding the identified voltage offset bin shift for the specified subset of cells to a stored voltage offset bin associated with the specified subset of cells (e.g., the voltage offset bin associated with the specified subset of cells prior to the power-off state). The relationship between the specified subset of cells and associated voltage offset bin can be a bin pointer (e.g., a TAP bin pointer). In some embodiments, SCL Monitor Component 113 can update the data structure as a part of a calibration operation (e.g., a BFEA calibration operation) to update read level values for various specified subsets of cells. In some embodiments, if SCL Monitor Component 113 determines that the specified subset of cells and another specified subset of cells have sufficiently similar characteristics (e.g., $V_T$s), SCL Monitor Component 113 can combine the two specified subsets of cells into a single specified subset of cells with the same bin pointer. In this way, bin pointers can be "recycled" to be used for a newly created block family. Further details with regard to the binset table and BFEA table are described below with reference to FIGS. 5A and 5B.

In some embodiments, SCL Monitor Component 113 can use the state of a subset of cells that have been programmed just before a power-off/standby event to determine a duration of the power-off state for the memory sub-system. Upon power-up, SCL Monitor Component 113 can determine a voltage shift in the way described above, by determining the lowest BER value from a set of reads, and comparing the lowest BER value voltage to the previous $V_T$ (e.g., a stored $V_T$). SCL Monitor Component 113 can use the voltage shift as an input value to a calibrated table in order to identify the duration of the power-off state. In some embodiments, the calibrated table can be a metadata table stored in memory sub-system controller 115, or another data structure stored on a memory device such as memory device 130. Further details with regards to the operations of the SCL Monitor Component 113 are described below.

Figure 2:
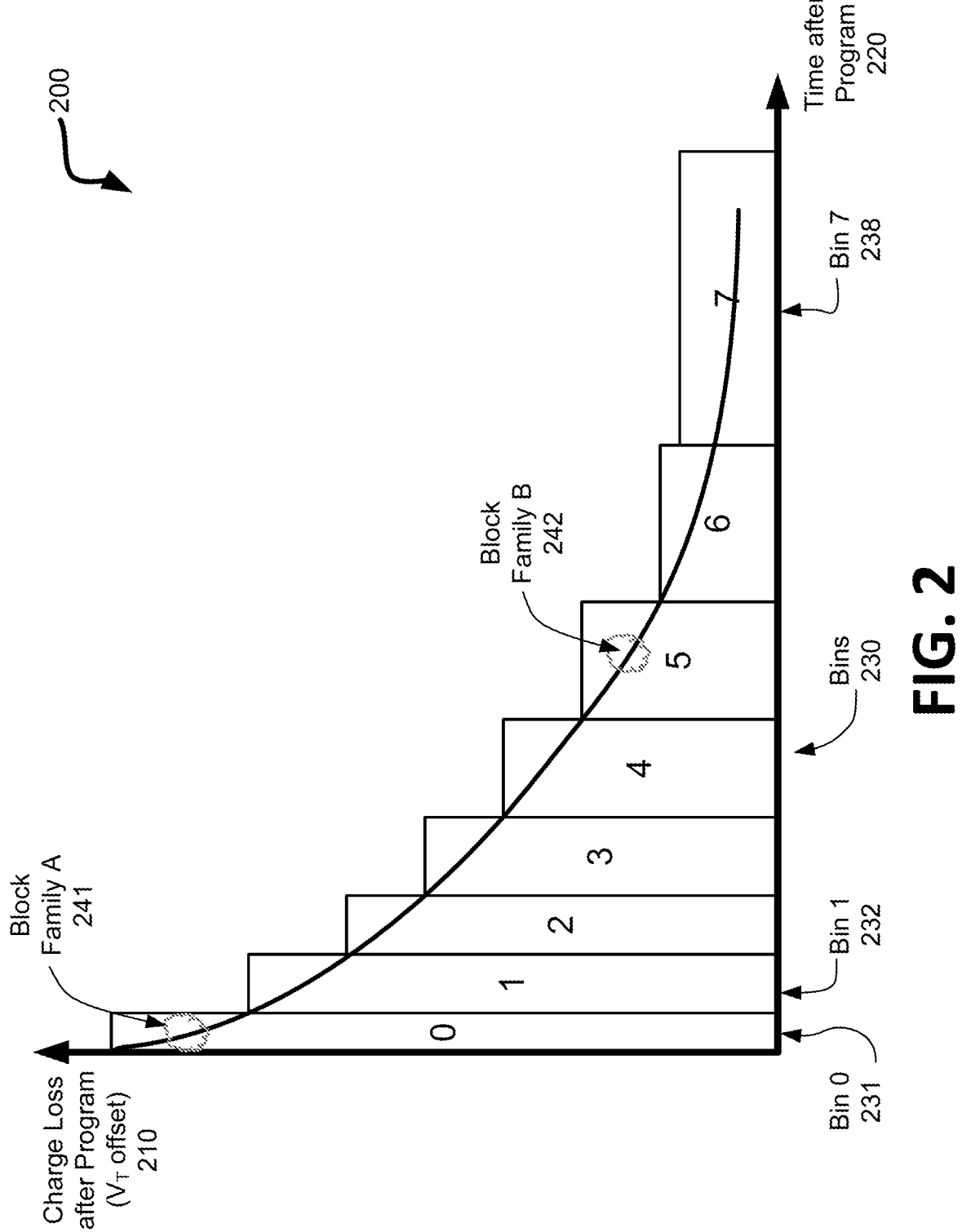
FIG. 2 depicts an example graph illustrating the dependency of charge loss after program ($V_T$ offset) on the time after program (i.e., the period of time elapsed since the block has been programmed), in accordance with some embodiments.

FIG. 2 depicts an example graph 200, illustrating the dependency of charge loss after program ($V_T$ offset) 210 on the time after program 220 (i.e., the period of time elapsed since the block has been programmed), in accordance with some embodiments. Graph 200 can be subdivided into multiple TAP bins 0-7 230 (shown as "bin 0" 231, "bin 1" 232, and "bin 7" 238) corresponding to time after program 220. Each bin (e.g., "bin 0" 231, etc.) corresponds to a predetermined range of threshold voltage offsets 210. While the illustrative example of FIG. 2 defines 8 bins, in other embodiments, other numbers of bins can be defined (e.g., 4 bins, 64 bins, etc.).

Blocks of the memory device are grouped into block families, such as block family "A" 241 and block family "B" 242. A block family can include one or more blocks that have been programmed within a specified time window and/or a specified temperature window. As noted herein above, since the time elapsed after programming and temperature are the main factors affecting the TVS (e.g., the voltage shift), blocks and/or partitions within a single block family (such as block family "A" 241 or block family "B" 242) are presumed to exhibit similar distributions of threshold voltages in memory cells, and thus would require the same voltage offsets for read operations.

Block families can be created asynchronously with respect to block programming events. Over time and/or with changes in temperature, the $V_T$ distribution of block family "A" 241 can move closer to the $V_T$ distribution of block family "B" 242 currently shown in TAP bin 5. For example, the memory subsystem controller (such as memory subsystem controller 115 as described with respect to FIG. 1) can create a new block family whenever a specified period of time (e.g., a predetermined number of minutes) has elapsed since creation of the last block family. Additionally, or alternatively, the memory sub-system controller (such as memory sub-system controller 115 as described with respect to FIG. 1) can create a new block family whenever the reference temperature of memory cells has changed by more than a specified threshold value since creation of the current block family. In some embodiments, the reference temperature of memory cells can be updated at specified time intervals, and/or in response to a triggering event.

A newly created block family, such as block family "A" 241, can be associated with bin 0. Based on a periodically performed calibration process, the memory sub-system controller (such as memory sub-system controller 115 as described with respect to FIG. 1) associates each block family (e.g., such as block family "A" 241, or block family "B" 242) with a TAP bin (e.g., a voltage offset bin). A TAP bin defines a set of voltage offsets to be applied to the base voltage read level in order to perform read operations, as described in more detail herein below. The associations of blocks with block families, as well as the associations of block families with TAP bins, can be stored in respective metadata tables maintained by the memory sub-system controller. In some embodiments, the associations of blocks with block families and/or the associations of block families with TAP bins can be stored in one or more BFEA tables.

Figure 3:
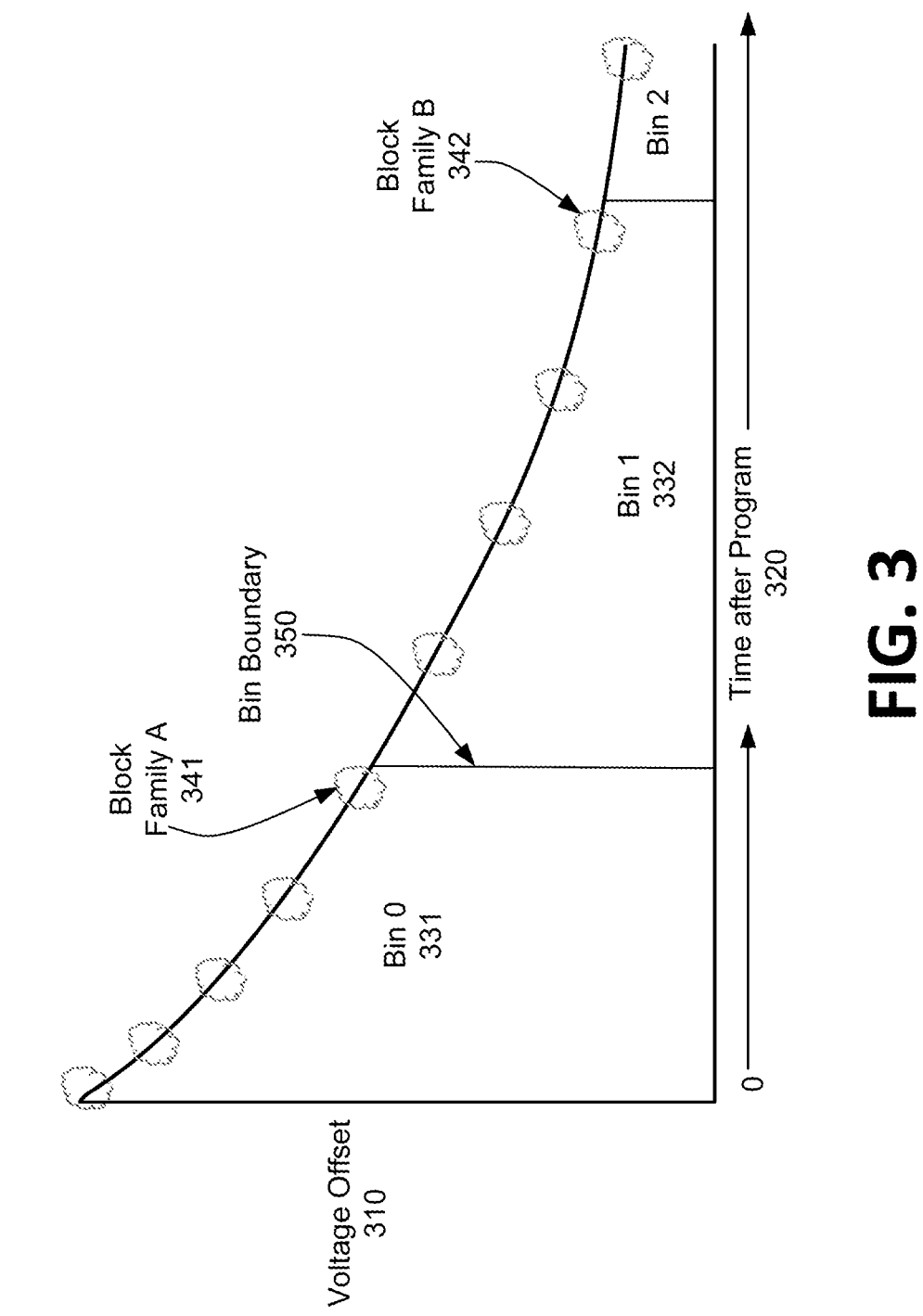
FIG. 3 schematically illustrates selecting block families for calibration, in accordance with embodiments.

FIG. 3 schematically illustrates selecting block families for calibration, in accordance with some embodiments. The memory sub-system controller (such as memory sub-system controller 115 as described with respect to FIG. 1) can perform the calibration operations on one of the oldest block families in each bin (e.g., the block family having the longest time after program 320 value, and thus the lowest voltage offset 310 value of the bin). As illustratively exemplified, the memory sub-system controller can perform calibration operations on block family "A" 341 in "bin 0" 331 and block family "B" 342 in "bin 1" 332, since each are the oldest block family that will, due to slow charge loss, migrate across bin boundary 350 (e.g., a predetermined bin voltage boundary) to the next bin before any other block family of each current respective bins.

Figure 4:
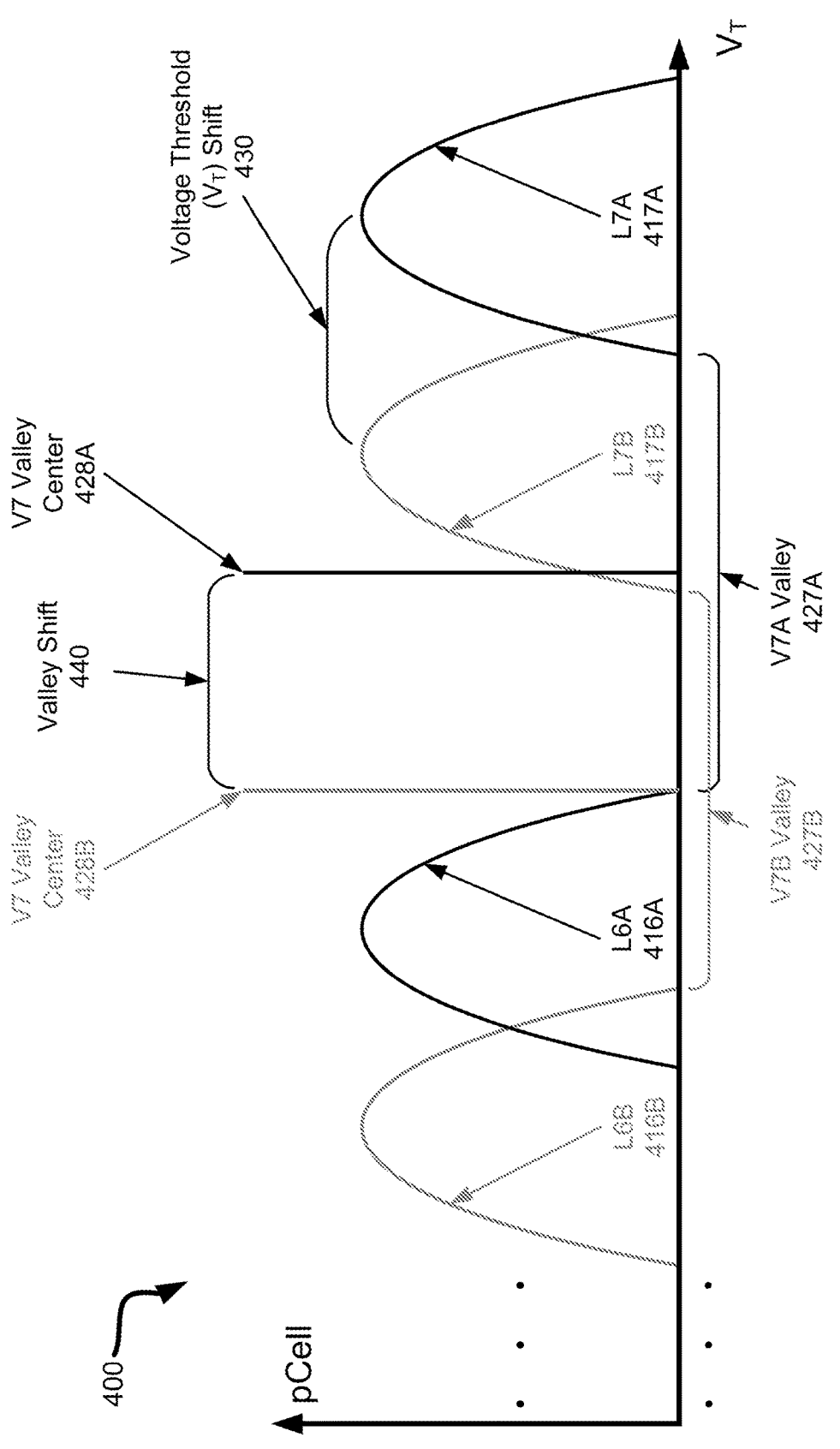
FIG. 4 illustrates an example memory cell distribution probability graph, in accordance with some embodiments.

FIG. 4 illustrates an example memory cell distribution probability graph 400, in accordance with some embodiments. Black lines (L6A 416A, L7A 417A) denote an initial voltage distribution. Gray lines (L6B 416B, L7B 417B) denote a shifted voltage distribution. $V_T$ distributions can shift (e.g., from the black lines L6A 416A, L7A 417A, to the grey lines L6B 416B, L7B 417B) during a duration of a power-off state.

In some embodiments, level 7 can be a highest programmable level of a memory cell. In some embodiments, other highest programmable levels are considered (e.g., such as a level 15 "L15"). Valley 7 can be between the highest programmable level of a cell stack and the next highest programmable level of a cell stack (e.g., the valley margin between level 6 and level 7). For example, "V7A" 427A can be between "L6A" 416A and "L7A" 417A in an initial position, and "V7B" 427B can be between "L6B" 416B and "L7A" 417B in a shifted position.

Valley center 428A can be the center of "V7A" 427A (e.g., the center of the valley margin between "L6A" 416A and "L7A" 417A), and valley center 428B can be the center of "V7B" 427B. In some embodiments, voltage shift 430 can be the difference between the peak of "L7A" 417A (e.g., the initial $V_T$ threshold) and "L7B" 417B (e.g., the shifted $V_T$ threshold). In some embodiments, valley shift 440 can be the difference between valley center 428A in the initial position, and valley center 428B in a shifted position.

Valley shift 440 can correspond to voltage shift 430. Voltage shift can be determined by identifying the position of valley center 428B, and comparing the value of valley center 428B with the value of valley center 428A. Multiple reads of "L6B" 416B and "L7B" 417B can determine valley center 428B by identifying which read of the multiple reads corresponds to the lowest number of detected bits between "L6B" 416B and "L7B" 417B. In some embodiments, valley center 428B can be the read level with the lowest BER between "L6B" 416B and "L7B" 417B.

Figures 5A, 5B:
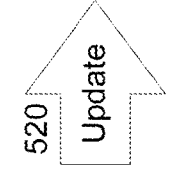
FIG. 5A illustrates an example block family-based error avoidance (BFEA) table update process in accordance with some embodiments.
FIG. 5B illustrates an example binset table in accordance with some embodiments.

FIG. 5A illustrates an example block family-based error avoidance (BFEA) table update process 500 in accordance with some embodiments.

BFEA table 510 illustrates an example data structure that can be maintained by a memory sub-system controller (such as memory sub-system controller 115 as described with respect to FIG. 1) to store the association between a specified subset of cells and a corresponding voltage offset bin. Each entry of the BFEA table 510 specifies a voltage offset bin (e.g., TAP bin) associated with a corresponding block family on each die (e.g., die0, die1, etc.). For example, BFEA table 510 depicts that Block Family 1 on die0 is associated with voltage offset bin 1, and that Block Family 64 on die1 is associated with voltage offset bin 4, etc.

Update 520 illustrates the portion of the process performed by the SCL Monitor Component (e.g., SCL Monitor Component 113 of FIG. 1) that corresponds to updating the BFEA table (e.g., such as operation 630 as described below with respect to FIG. 6). In some embodiments, update 520 can include a calibration operation (e.g., BFEA calibration operation), where bin pointers (e.g., TAP bin pointers) corresponding to block families can be rearranged or reassigned based on calibration parameters (e.g., the determined voltage shift as described with respect to FIG. 2, and/or changes in time/temperature, etc.).

Updated BFEA table 530 illustrates the changes made to BFEA table 510 by the SCL Monitor Component (e.g., SCL Monitor Component 113 as described with reference to FIG. 1) after update 520. For example, as shown in updated BFEA table 530, upon determining a voltage shift from a power-off state, SCL Monitor Component can update the bin pointer for Block Family 1 on die0 to correspond to voltage offset bin 4 based on the determined voltage shift. Entries in the BFEA table need not be updated if the pointer value (e.g., the association between a block family and a corresponding voltage offset bin) remains the same. For example, as shown in updated BFEA table 530, after SCL Monitor Component has performed its process, Block Family 2 on die0 might still be associated with voltage offset bin 6, which is the same voltage offset bin 6 it was previously associated with.

FIG. 5B illustrates an example binset table 550 in accordance with some embodiments. Binset table 550 illustrates an example data structure that can be maintained by a memory sub-system controller (such as memory sub-system controller 115 as described with respect to FIG. 1) to store the relationship between a voltage shift and a voltage offset bin shift corresponding to a given voltage offset bin. The data structure can be a metadata table, each entry of which mapping an output value for a voltage offset bin pointer update (e.g., voltage offset bin shift) to a corresponding value for a given voltage offset bin associated with a given specified set of cells (e.g., a block family). The data structure can be programmed during manufacturing, and can reflect physical memory characteristics of the memory device/die, and/or memory performance characteristics. Since the threshold voltage changes rapidly shortly after programming, (e.g., when block families are assigned to a low bin such as bin 0) and then slows down with respect to the time elapsed since the cell programming event, the determined voltage shift can affect voltage offset bin pointers differently for block families assigned to a low voltage offset bin (e.g., such as voltage offset bins 0-2) as compared to block families assigned to higher bins (e.g., such as voltage offset bins 3-7). For example, a detected voltage shift can result in a block family assigned to voltage offset bin 0 being reassigned to voltage offset bin 3, while the same determined voltage shift can result in a block family assigned to voltage offset bin 3 remaining in voltage offset bin 3.

As shown in the illustrative example of binset table 550, a larger voltage shift can cause a block family assigned to voltage offset bin 0 to be reassigned to voltage offset bin 4, while a smaller voltage shift can cause a block family assigned to voltage offset bin 0 to be reassigned to voltage offset bin 2. As described above, a longer duration of a power-off state can result in the memory sub-system experiencing a larger voltage shift upon power-up, and a shorter duration of the power-off state can result in the memory sub-system experiencing a smaller voltage shift upon power-up. For the purposes of this example embodiment, "larger" and "smaller" are used comparative to each other to show that different voltage shifts can have different effects on each voltage offset bin. It should be noted that the values in binset table 550 are for illustrative purposes only, and are not intended as a restriction or limitation.

FIG. 6 is a flow diagram of an example method 600 in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the SCL Monitor Component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, responsive to detecting a power-off event, processing logic programs, to a predefined logical state, a dummy subset of a plurality of cells. Processing logic can select the dummy subset of the plurality of cells based on various memory operations or conditions. In some embodiments, the dummy subset of the plurality of cells can be a dedicated subset of memory cells of a memory device. In some embodiments, the dummy subset can be a memory page. Processing logic can program a set of data to the dummy subset. In some embodiments, the set of data can be a random data set. In some embodiments, processing logic can identify a time when the dummy subset of the plurality of cells is programmed (e.g., a programming time of the dummy subset of the plurality of cells). In some embodiments, processing logic can identify a programming valley center from the predefined logical state. Processing logic can determine a programming temperature associated with programming the dummy subset of the plurality of cells. The programming temperature can be based on one or more memory device/memory sub-system physical characteristics. The programming temperature can correspond to a temperature of a memory device (e.g., memory die) and/or a temperature of a memory sub-system. In some embodiments, the programming temperature can correspond to a temperature of the dummy subset of the plurality of cells. The memory device and/or memory sub-system can include a temperature probe. In some embodiments, the dummy subset of the plurality of cells can include a dedicated temperature probe. Processing logic can determine a power-up temperature of the memory sub-system. The power-up temperature can be associated with the power-up event. In some embodiments, the power-up temperature can correspond to a time the power-up event occurs. Processing logic can determine a temperature change between the program temperature and the power-up temperature. The voltage offset bin shift can correspond to the temperature change. In some embodiments, a larger temperature change can correspond to a larger change in the voltage offset bin shift (e.g., a larger value of the voltage offset bin shift).

In some embodiments, the power-off event can occur in response to a request sent by the host system 120, such as a shutdown or standby request. In some embodiments, the power-off event can occur in response to a request sent by the memory sub-system controller 115. The power-off event can be a synchronous event (e.g., an expected event, such as in response to a power-off request), or an asynchronous event (e.g., an unexpected event due to unforeseen power loss). Processing logic can determine whether the power-off event was an asynchronous power event. For asynchronous power events, in some embodiments, a capacitor can briefly power the memory sub-system (such as memory sub-system 110 as described with respect to FIG. 1) before the memory sub-system powers off. The capacitor can power the memory sub-system long enough for the memory sub-system controller to complete one or more power-off memory operations, including programming the dummy subset of the plurality of cells as described above in operation 610.

At operation 620, responsive to detecting a power-up event, processing logic determines a voltage shift associated with the dummy subset of the plurality of cells. In some embodiments, processing logic can determine a duration of a power-off state. Processing logic can use the voltage shift as an input value for a calibrated table to identify an output value of the duration of the power-off state. Processing logic can use the voltage shift as an input value for a pre-calibrated table (e.g., a static table pre-calibrated during production of the memory sub-system) to identify an output value of a voltage offset bin shift for the dummy subset of the plurality of cells. In some embodiments, processing logic can use the voltage shift as an input value for a pre-calibrated table to identify one or more output values of voltage offset bin shifts for block families on a memory device.

The voltage shift associated with the dummy subset of the plurality of cells can correspond to the voltage shift that the dummy subset experienced during a power-off state. A duration of the power-off state can correspond to a voltage offset bin shift. In some embodiments, a longer duration of the power-off state can correspond to a larger change in the voltage offset bin (i.e., a longer duration can correspond to a larger value of the voltage offset bin shift). Processing logic can determine the voltage shift of the dummy subset of the plurality of cells by applying a read voltage to the dummy subset and determining the number of bits above the read voltage and the number of bits below the read voltage. The applied read voltage can correspond to a valley voltage (e.g., valley center) of a memory cell having multiple levels (e.g., a multi-level cell "MLC," a tri-level cell "TLC," a quad-level cell "QLC," etc.). Processing logic can determine the voltage shift of the dummy subset of the plurality of cells by measuring the shift of a valley center (e.g., the center of a valley between two adjacent voltage distributions corresponding to respective logical levels) of the dummy subset of the plurality of cells. In some embodiments, processing logic can determine the valley center of a highest voltage distribution valley of the dummy subset of the plurality of cells. The highest voltage distribution valley of the memory cell can be the voltage gap (e.g., valley margin) between a highest programmable level of the memory cell, and a second highest programmable level of the memory cell as described above with reference to FIG. 4. A valley shift (i.e., the change in position of the valley from before the power-off state to the position of the valley after the power-off state) of a valley center of the dummy subset of the plurality of cells can correspond to the voltage shift for the dummy subset of memory cells.

In some embodiments, potential time savings at operation 620 can increase exponentially for each additional block family. For example, in at least one embodiment, processing logic can read a dummy subset of the plurality of cells to determine the voltage shift for the memory device, and thus can determine the voltage shift nearly 63 times faster for a memory device having 64 block families (e.g., reading and processing the dummy subset can provide the voltage shift information that reading 64 block families also provides, representing a 63× time saver).

At operation 630, processing logic identifies, based on the voltage shift, a voltage offset bin shift corresponding to a voltage offset bin associated with a specified subset of the plurality of cells. The voltage offset bin can be a TAP bin such as "bin 0" 331 as described with reference to FIG. 3. Bin pointers, such as TAP bin pointers described with reference to FIG. 4 can represent the association between the specified subset of the plurality of cells (e.g., a block family) and the corresponding TAP bin (e.g., voltage offset bin).

Processing logic can update a data structure (such as BFEA table 510 as described with respect to FIG. 5A) to reflect changes to a voltage offset bin corresponding to a block family as a result of the voltage shift. Processing logic can add the value of the voltage offset bin shift to a value of a stored voltage offset bin for the block family and store the updated value in the data structure as an updated voltage offset bin for the block family. The data structure can be a bin pointer metadata table associated with a group of block families as depicted in BFEA table 510 and updated BFEA table 530 as described with respect to FIG. 5A. In some embodiments, at least part of the data structure can be cached in a local memory component, such as local memory 119 of the memory sub-system controller 115 as described with respect to FIG. 1. Processing logic can determine whether a stored voltage offset bin in the data structure corresponding to a block family is affected by a voltage offset bin shift (i.e., processing logic can determine if the voltage offset bin shift for the corresponding block family is greater than 0). In some embodiments, processing logic can update the stored voltage offset bin to reflect changes from the corresponding voltage offset bin shift. In some embodiments, processing logic can add the value of the voltage offset bin shift to the value of stored voltage offset bin to create an updated voltage offset bin (e.g., voltage offset bin shift+stored voltage offset bin=updated voltage offset bin). For example, the stored bin voltage offset bin for block family "X" points to bin "N," but the updated voltage offset bin for block family "X" may points to bin "N+1," when the voltage offset bin shift is equal to 1. Processing logic can replace the stored voltage offset bin in the data structure with the updated voltage offset bin to reflect that block family "X" has moved from bin "N" to bin "N+1," such as is depicted by process 500 as described with respect to FIG. 5A).

In some embodiments, processing logic can map the voltage shift to the voltage offset bin shift with a static table (e.g., binset table), such as binset table 550 as described with to FIG. 5B. The corresponding binset table can be a metadata table associated with the plurality of cells. In some embodiments, at least part of the binset metadata table can be cached in a local memory component.

Figure 7:
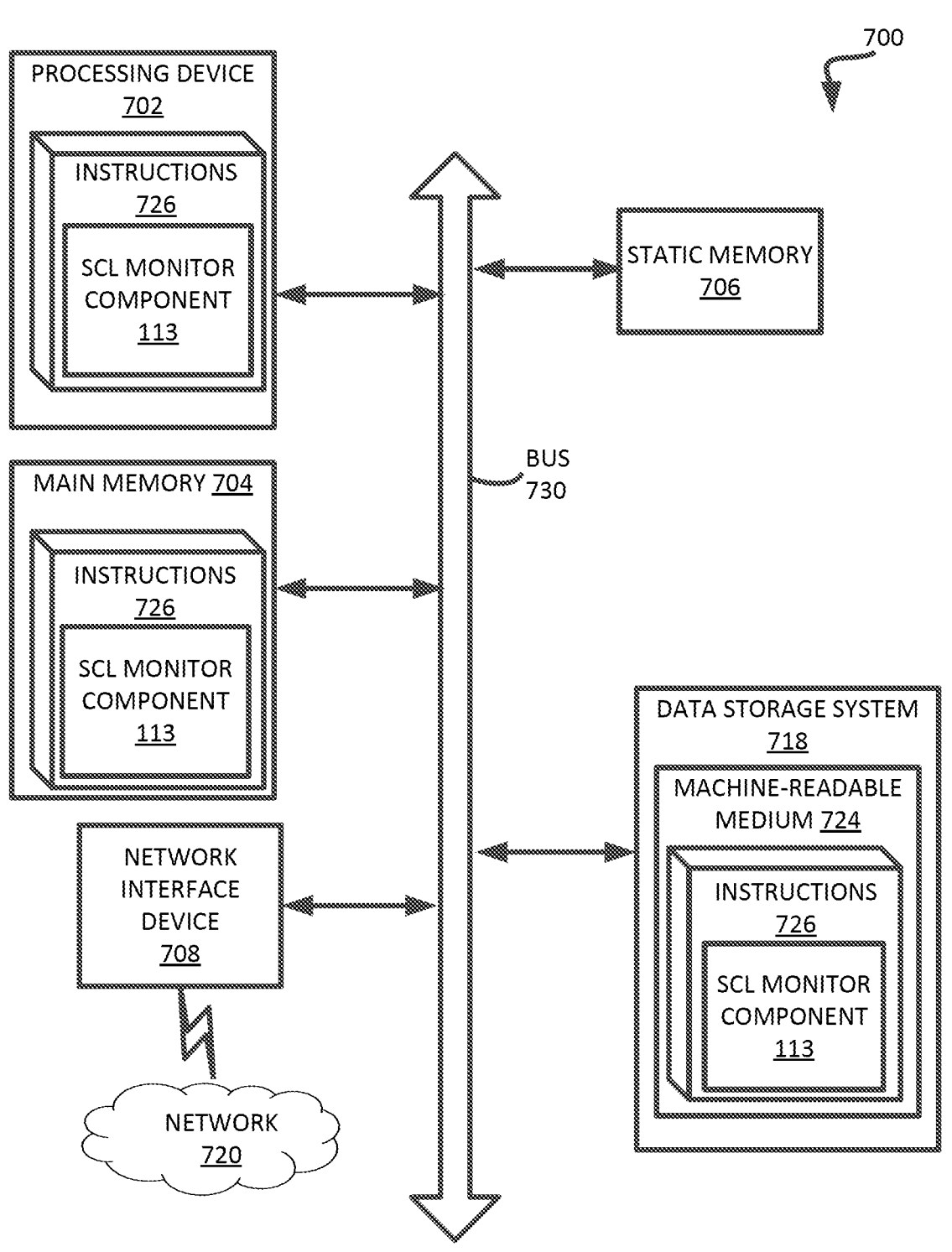
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the SCL Monitor Component 113 of FIG. 1, to monitor SCL for power-up performance boosting). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement SCL monitoring functionality corresponding to a SCL Monitor Component (e.g., the SCL Monitor Component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (e.g., non-transitory computer-readable storage medium) having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:

a memory device comprising a plurality of cells; and a processing device operatively coupled to the memory device, the processing device to perform operations comprising:

responsive to detecting a power-off event, programming, to a predefined logical state, a dummy subset of the plurality of cells;

responsive to detecting a power-up event, determining a voltage shift associated with the dummy subset of the plurality of cells; and identifying, based on the voltage shift, a voltage offset bin shift corresponding to a first voltage offset bin of a plurality of voltage offset bins, the first voltage offset bin associated with a specified subset of the plurality of cells based on a time after programming the specified subset of the plurality of cells, and wherein the first voltage offset bin defines a set of voltage offsets to be applied to a base read voltage level.

2. The memory sub-system of claim 1, the operations further comprising:

determining, based on the voltage offset bin shift, a duration of a power-off state associated with the power-off event.

3. The memory sub-system of claim 1, the operations further comprising:

determining a program temperature of the memory sub-system, wherein the program temperature corresponds to programming the dummy subset of the plurality of cells;

identifying a power-up temperature of the memory sub-system, wherein the power-up temperature is associated with the power-up event; and adjusting the voltage offset bin shift based on a difference between the program temperature and the power-up temperature.

4. The memory sub-system of claim 1, the operations further comprising:

updating an entry corresponding to the specified subset of the plurality of cells in a data structure, wherein the entry comprises a stored voltage offset bin.

5. The memory sub-system of claim 1, wherein identifying, based on the voltage shift, the voltage offset bin shift corresponding to the voltage offset bin associated with the specified subset of the plurality of cells further comprises:

mapping, using a data structure, the voltage shift to the voltage offset bin shift.

6. The memory sub-system of claim 1, wherein determining the voltage shift associated with the dummy subset of the plurality of cells responsive to detecting the power-up event further comprises:

determining a valley center of a highest voltage distribution valley of the plurality of cells;

identifying a programming valley center of the highest voltage distribution valley for the predefined logical state programmed to the dummy subset of the plurality of cells; and determining the voltage shift based on a difference of the valley center and the programming valley center.

7. The memory sub-system of claim 1, wherein the power-off event comprises an asynchronous power event.

8. A method comprising:

responsive to detecting a power-off event, programming, to a predefined logical state, by a processing device, a dummy subset of a plurality of cells;

responsive to detecting a power-up event, determining a voltage shift associated with the dummy subset of the plurality of cells; and identifying, based on the voltage shift, a voltage offset bin shift corresponding to a voltage offset bin associated with a specified subset of the plurality of cells based on a time after programming the specified subset of the plurality of cells, and wherein the first voltage offset bin defines a set of voltage offsets to be applied to a base read voltage level.

9. The method of claim 8, the method further comprising:

determining, based on the voltage offset bin shift, a duration of a power-off state associated with the power-off event.

10. The method of claim 8, the method further comprising:

determining a program temperature of the plurality of cells, wherein the program temperature corresponds to programming the dummy subset of the plurality of cells;

identifying a power-up temperature of the plurality of cells, wherein the power-up temperature is associated with the power-up event; and adjusting the voltage offset bin shift based on a difference between the program temperature and the power-up temperature.

11. The method of claim 8, the method further comprising:

updating an entry corresponding to the specified subset of the plurality of cells in a data structure, wherein the entry comprises a stored voltage offset bin.

12. The method of claim 8, wherein identifying, based on the voltage shift, the voltage offset bin shift corresponding to the voltage offset bin associated with the specified subset of the plurality of cells further comprises:

mapping, using a data structure, the voltage shift to the voltage offset bin shift.

13. The method of claim 8, wherein determining the voltage shift associated with the dummy subset of the plurality of cells responsive to detecting the power-up event further comprises:

determining a valley center of a highest voltage distribution valley of the plurality of cells;

identifying a programming valley center of the highest voltage distribution valley for the predefined logical state programmed to the dummy subset of the plurality of cells; and determining the voltage shift based on a difference of the valley center and the programming valley center.

14. The method of claim 8, wherein the power-off event comprises an asynchronous power event.

15. A non-transitory computer-readable storage medium comprising instructions that, when executed by a processing device, cause the processing device to perform operations comprising:

responsive to detecting a power-off event, programming, to a predefined logical state, a dummy subset of a plurality of cells;

responsive to detecting a power-up event, determining a voltage shift associated with the dummy subset of the plurality of cells; and identifying, based on the voltage shift a voltage offset bin shift corresponding to a voltage offset bin associated with a specified subset of the plurality of cells based on a time after programming the specified subset of the plurality of cells, and wherein the first voltage offset bin defines a set of voltage offsets to be applied to a base read voltage level.

16. The non-transitory computer-readable storage medium of claim 15, the operations further comprising:

determining, based on the voltage offset bin shift, a duration of a power-off state associated with the power-off event; and determining a program temperature of the plurality of cells, wherein the program temperature corresponds to programming the dummy subset of the plurality of cells;

identifying a power-up temperature of the plurality of cells, wherein the power-up temperature is associated with the power-up event; and adjusting the voltage offset bin shift based on a difference between the program temperature and the power-up temperature.

17. The non-transitory computer-readable storage medium of claim 15, the operations further comprising:

updating an entry corresponding to the specified subset of the plurality of cells in a data structure, wherein the entry comprises a stored voltage offset bin.

18. The non-transitory computer-readable storage medium of claim 15, wherein identifying, based on the voltage shift, the voltage offset bin shift corresponding to the voltage offset bin associated with the specified subset of the plurality of cells further comprises:

mapping, using a data structure, the voltage shift to the voltage offset bin shift.

19. The non-transitory computer-readable storage medium of claim 15, wherein determining the voltage shift associated with the dummy subset of the plurality of cells responsive to detecting the power-up event further comprises:

determining a valley center of a highest voltage distribution valley of the plurality of cells;

identifying a programming valley center of the highest voltage distribution valley for the predefined logical state programmed to the dummy subset of the plurality of cells; and determining the voltage shift based on a difference of the valley center and the programming valley center.

20. The non-transitory computer-readable storage medium of claim 15, wherein the power-off event comprises an asynchronous power event.

* * * * *